United States Patent
Souria et al.

(10) Patent No.: US 9,711,471 B2
(45) Date of Patent: Jul. 18, 2017

(54) SEMICONDUCTOR DEVICE PACKAGE, ELECTRONIC DEVICE AND METHOD OF MANUFACTURING ELECTRONIC DEVICES USING WAFER LEVEL CHIP SCALE PACKAGE TECHNOLOGY

(71) Applicant: FREESCALE SEMICONDUCTOR, INC., Austin, TX (US)

(72) Inventors: Charaf-Eddine Souria, Toulouse (FR); Gilles Montoriol, Plaisance du Touch (FR); Stéphane Damien Thuries, Saubens (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/131,555

(22) Filed: Apr. 18, 2016

(65) Prior Publication Data

US 2017/0141057 A1    May 18, 2017

(30) Foreign Application Priority Data

Nov. 18, 2015  (WO) .................. PCT/IB2015/002371

(51) Int. Cl.
*H01L 23/00* (2006.01)
(52) U.S. Cl.
CPC .............. *H01L 24/05* (2013.01); *H01L 24/03* (2013.01); *H01L 24/13* (2013.01); *H01L 24/94* (2013.01); *H01L 2224/0401* (2013.01); *H01L 2224/05025* (2013.01); *H01L 2224/13014* (2013.01); *H01L 2224/13026* (2013.01); *H01L 2924/014* (2013.01); *H01L 2924/30205* (2013.01)

(58) Field of Classification Search
CPC ......... H01L 24/02; H01L 24/04; H01L 24/07; H01L 24/03; H01L 24/05; H01L 24/13
See application file for complete search history.

(56) References Cited

U.S. PATENT DOCUMENTS

| | | | |
|---|---|---|---|
| 5,502,337 A * | 3/1996 | Nozaki | H01L 23/5283 257/773 |
| 6,674,174 B2 | 1/2004 | Chungpaiboonpatana et al. | |
| 7,098,540 B1 | 8/2006 | Mohan et al. | |
| 7,566,952 B2 | 7/2009 | Floyd et al. | |
| 9,472,425 B2 * | 10/2016 | Song | H01L 23/49816 |
| 2016/0276173 A1 * | 9/2016 | Song | H01L 23/49816 |

* cited by examiner

*Primary Examiner* — Christine Enad

(57) ABSTRACT

A semiconductor device package comprising a circuit chip and a wafer level chip scale package is designed for reducing capacitive interactions which exist between electrically conducting portions of the circuit chip and under-bump metallization areas of the package. Such design is beneficial in particular for under-bump metallization areas which are dedicated to transferring signals having frequencies above 30 GHz.

15 Claims, 5 Drawing Sheets

SEMICONDUCTOR DEVICE PACKAGE, ELECTRONIC DEVICE AND METHOD OF MANUFACTURING ELECTRONIC DEVICES USING WAFER LEVEL CHIP SCALE PACKAGE TECHNOLOGY

CROSS REFERENCE TO RELATED APPLICATION(S)

The present application claims priority to International Patent Application No. PCT/IB2015/002371, entitled "SEMICONDUCTOR DEVICE PACKAGE, ELECTRONIC DEVICE AND METHOD OF MANUFACTURING ELECTRONIC DEVICES USING WAFER LEVEL CHIP SCALE PACKAGE TECHNOLOGY," filed on Nov. 18, 2015, the entirety of which is herein incorporated by reference.

FIELD OF THE INVENTION

This invention relates to a semiconductor device package, an electronic device and a method of manufacturing electronic devices using wafer level chip scale package technology.

BACKGROUND OF THE INVENTION

An integrated circuit is commonly comprised of a circuit chip and a package, and called semiconductor device package by the Man skilled in electronic circuit manufacturing.

The circuit chip includes a semiconductor substrate which has an upper substrate surface, and further includes several interconnect layers which are stacked on the upper substrate surface. The upper substrate surface and the upper stack surface are both generally perpendicular to a stacking direction of the integrated circuit. The substrate incorporates electrically doped regions having electrical resistivity values of less than 10 Ohm·cm, which form parts of electronic components of the circuit. Metal tracks and vias are formed on and through the interconnect layers, respectively, which are configured for electrically connecting the electronic components.

Bond pads are located at an upper layer surface of the layer stack opposite the semiconductor substrate. The bond pads are electrically connected to some of the tracks and vias at one end, and to external electrical contacts of the circuit on the other end.

One function of the package is to spatially redistribute the bond pads to or from the electrical contacts. The electrical contacts allow the mounting of the integrated circuit on an external support, such as a printed circuit board (PCB) or a low-temperature co-fired ceramic (LTCC) used as a circuit support.

Several technologies have been developed for the package. A widely used technology is the so-called redistributed chip package (RCP). After a semiconductor wafer has been processed for producing the electronic components and the stack of interconnect layers, it is cut into separate pieces, each forming a circuit chip. The circuit chips are then individually embedded into a respective RCP module. The electrical contacts of the RCP module for connection to the external support are distributed according to a fan-out design wherein the contacts to the external support are located externally around the circuit chip in a top view of the module. Thanks to such design, there is almost no capacitive interaction between the chip and the electrical contacts of the RCP module to the external support. But the resulting integrated circuit is significantly larger than the circuit chip and requires corresponding available surface on the external support. Additionally, individually embedding each circuit chip into a respective RCP module causes significant manufacturing cost.

An alternative technology to RCP is that called wafer level chip scale package (WLCSP). The wafer level chip scale package is located on the upper stack surface of the circuit chip opposite the semiconductor substrate. It incorporates a plurality of under-bump metallization areas each provided with a respective solder ball. The solder balls are dedicated for connecting the integrated circuit to an external support. The wafer level chip scale package further incorporates electrically conducting segments which extend parallel to the upper stack surface. These electrically conducting segments each connect at least one of the bond pads to at least one of the under-bump metallization areas.

An advantage of the WLCSP technology is that the package is produced for the whole wafer at one time before the wafer is cut into separate circuit chips. The package is produced by implementing material layer deposition and selective etching steps over the entire wafer area. These deposition and etching steps include forming of polyimide layers, forming of the electrically conducting segments and forming of the under-bump metallization areas. Then, the cutting step directly produces the integrated circuits each already provided with its wafer level chip scale package.

According to a usually implemented layout for integrated circuit chips, the layers are delimited by a seal ring at the periphery of the chip. Then, the bond pads are arranged together with associated devices along the seal ring, on the inner side of the seal ring with respect to the external chip limit, for protection against electrostatic discharge (ESD). The electrically conducting segments within the wafer level chip scale package extend at least partially in one direction opposite the external chip limit, so that the under-bump metallization areas are shifted towards a center zone of the chip, in projection within the upper stack surface. Because of such inwardly shifted location of each under-bump metallization area with respect to the bond pads, the under-bump metallization areas are situated above functional blocks in the chip. Such functional blocks are circuit parts designed in the substrate and in the layers, which can be dedicated to specific functions such as signal processing and amplification, for example. When the electrical contact at each under-bump metallization area is dedicated to power supply, grounding or low-frequency signal transmission, no problem arises from the under-bump metallization area being above the circuit block. But when the under-bump metallization area is dedicated to transferring signals having a frequency higher than 30 GHz (gigahertz), for example, capacitive interactions can occur between electrically conducting parts of the circuit block and the under-bump metallization area. These interactions are nearly equivalent to short circuits for signals at such high frequency values, and may disturb the operation of the circuit.

SUMMARY OF THE INVENTION

The present invention provides a semiconductor device package, an electronic device and a method of fabricating electronic devices as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

For clarity sake, element sizes which appear in these figures do not correspond to actual dimensions or dimension ratios. Also, same reference signs which are indicated in different ones of these figures denote same elements of elements having identical function.

DETAILED DESCRIPTION OF THE PREFERRED EMBODIMENTS

Figure 1A:
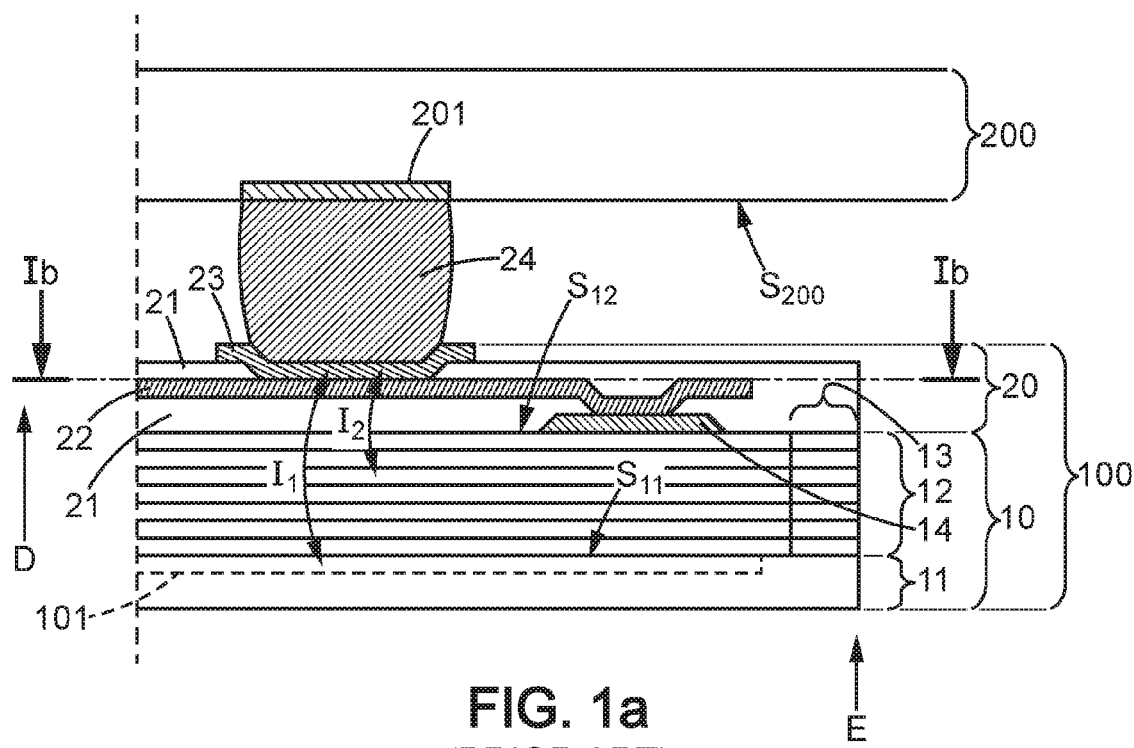
FIGS. 1a and 1b show a cross-sectional view and a top view, respectively, of a semiconductor device package according to the prior art.

Embodiments of the invention which will now be described provide a low-cost electrical circuit without operation disturbance due to capacitive interactions between circuit parts in the chip and electrically conducting parts of the circuit package. More specifically, embodiments allow suppressing capacitive interactions between circuit parts in the chip and some of the under-bump metallization areas of the wafer level chip scale package.

A first aspect of the invention thus proposes a semiconductor device package which includes circuit chip, bond pads and wafer level chip scale package as described above, and in which, for at least one of the under-bump metallization areas, called RF under-bump metallization area, the layers and the substrate are devoid of any material portion having an electrical resistivity less than 10 Ohm·cm within an exclusion cylinder which is based on the RF under-bump metal area and extends parallel to the stacking direction.

Thanks to such layout provided by the invention, there is no capacitive interaction between the RF under-bump metallization area and circuit parts which are located below in the circuit chip. The RF under-bump metallization area is therefore suitable for transferring signals having a frequency higher than 30 GHz, from the semiconductor device package to the external support or from the external support to the semiconductor device package, during an electrical operation of the semiconductor device package. For this reason, under-bump metallization areas which are provided according the first invention aspect are called RF under-bump metallization areas, although such invention under-bump metallization areas may be used for other purposes.

In some embodiments, the layers can be devoid of any metal portion within the exclusion cylinder for the RF under-bump metal area.

In further embodiments, the substrate can be devoid of electrical doping, or can have mutually compensating electrical doping loads within the exclusion cylinder for the RF under-bump metal area.

In still further embodiments, when considering projections parallel to the stacking direction onto a projection plane which is perpendicular to this stacking direction, the projection of the RF under-bump metallization area may be closer to the projection of a seal ring of the semiconductor device package, than the projection of the bond pad which is connected to the RF under-bump metallization area by an electrically conducting segment within the wafer level chip scale package. In this way, the semiconductor device package of the invention is compatible with usual assembling processes for connecting the semiconductor device package to an external support.

The semiconductor device package can further contain at least one other under-bump metallization area, which is separate from the RF under-bump metallization area in the wafer level chip scale package, called DC under-bump metallization area and unchanged by the invention. In particular, the projection of a bond pad which is connected to such DC under-bump metallization area by an electrically conducting segment within the wafer level chip scale package, can be closer to the projection of the seal ring than the projection of the DC under-bump metallization area.

Figure 2A:
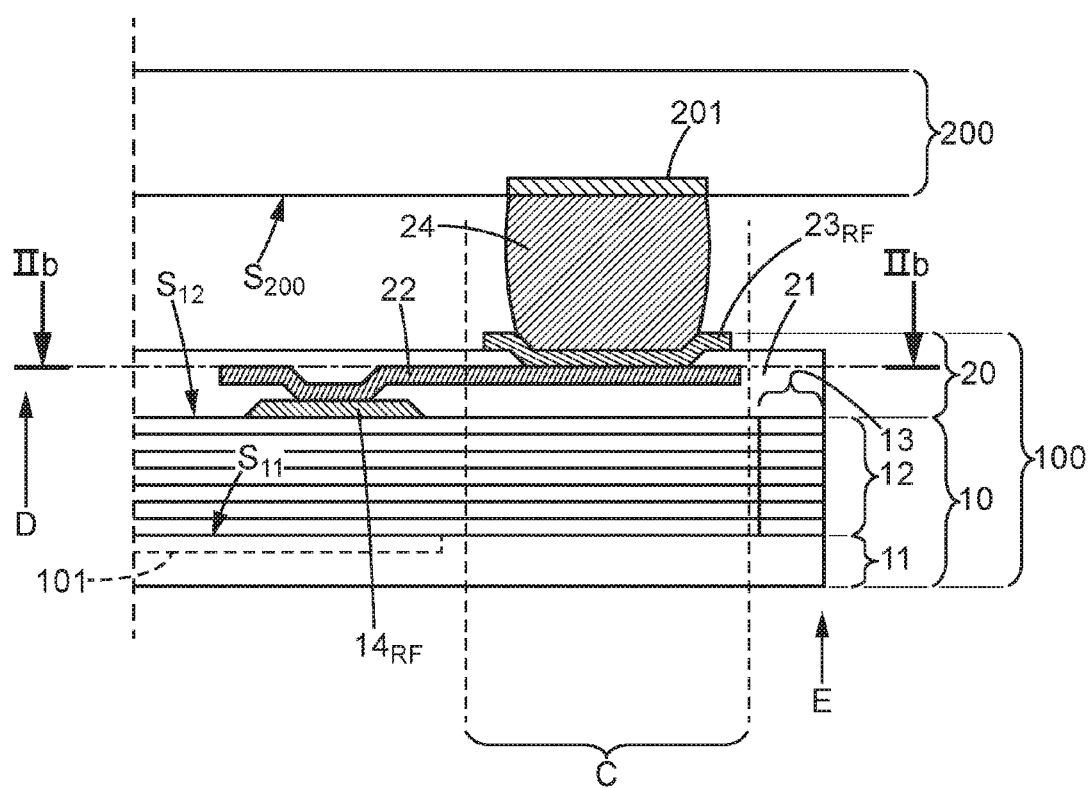
FIGS. 2a and 2b correspond to FIGS. 1a and 1b, respectively, but show an example of a semiconductor device package according to embodiments of the present invention.

In the present description, words such as "on", "above", "under" and "below" are used with respect to a layer stacking direction oriented as shown in the examples of FIGS. 1a and 2a. In these examples, the layer stacking direction is perpendicular to the layer stack surface.

Figure 1B:
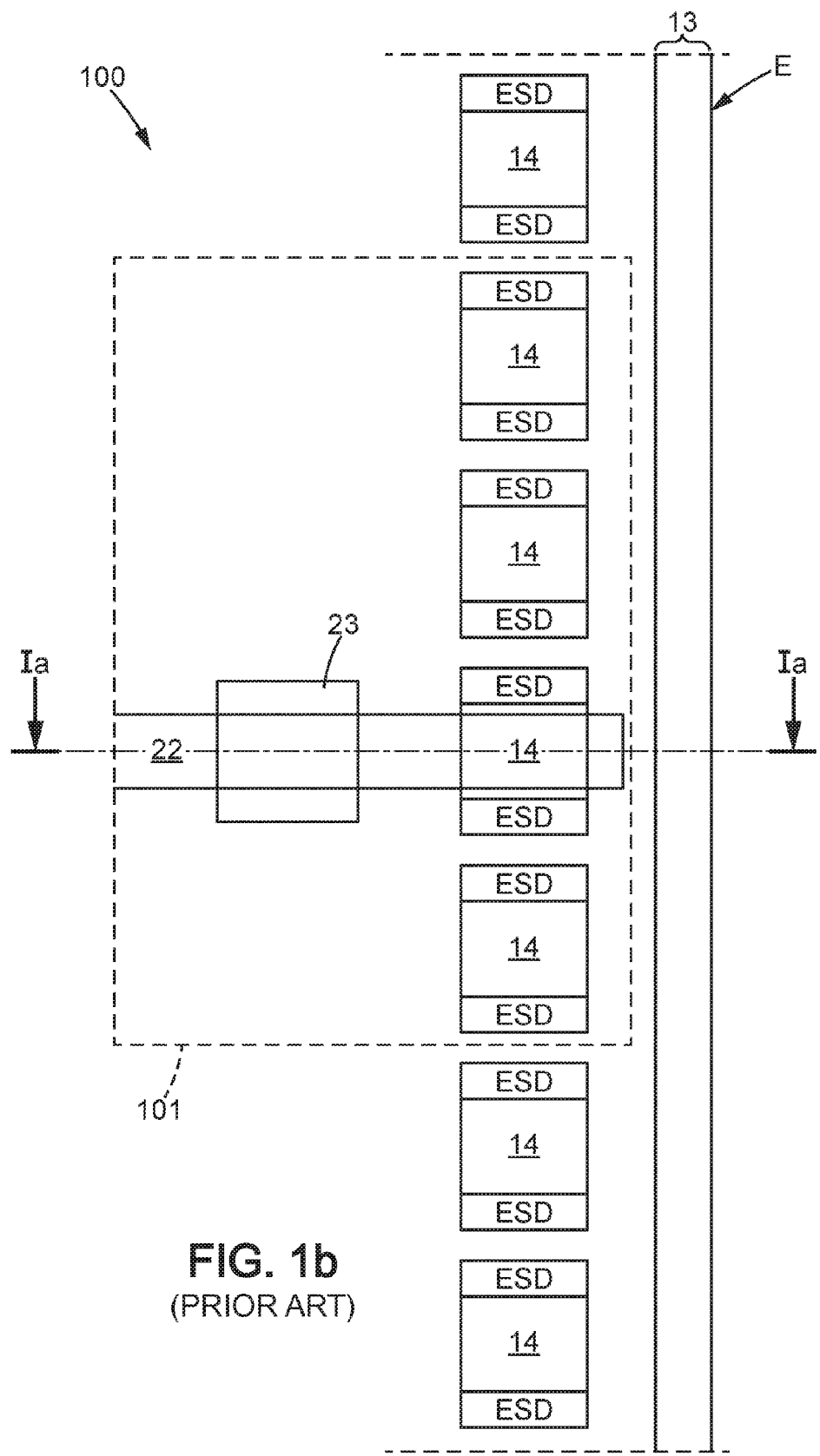

FIGS. 1a and 1b jointly illustrate a circuit layout for a semiconductor device package as known from prior art. Reference number 100 denotes the semiconductor device package as a whole, and reference number 200 denotes the external support on which the semiconductor device package 100 is affixed.

The semiconductor device package 100 comprises an electrical circuit chip 10 and a wafer level chip scale package (WLCSP) 20.

The electrical circuit chip 10 comprises a semiconductor substrate 11 and several interconnect layers 12, also called layers 12 hereafter, for example seven layers.

In a known manner, the semiconductor substrate 11 contains circuit blocks as that labelled 101, which may be each dedicated for performing an identified function, such as electrical power supply, electrostatic discharge protection, signal or data processing, signal amplification and transmission, etc.

The layers 12 are superposed on top of an upper substrate surface S11 so as to form a layer stack with stacking direction D. The layers 12 contain tracks and vias for connecting electrically electronic components which are contained in the circuit blocks. E denotes the external chip limit. The layers 12 are delimited by a seal ring 13 at the periphery of the circuit chip 10.

Bond pads 14 are arranged at an upper stack surface S12. The bond pads are also connected electrically by the tracks and vias of the layers 12 for allowing electrical operation of the circuit chip 10 when appropriately connected to external electrical devices such as power supply or signal/data transmission devices. In a well-known manner, each bond pad 14 is associated with a corresponding electrostatic discharge protection device, noted ESD, which is located within the circuit chip 10 close to this bond pad 14.

The wafer level chip scale package 20 comprises one or several electrically insulating layers 21, for example polyimide layers, and electrically conducting segments such as that labelled 22. Under-bump metallization areas such as that labelled 23 are arranged at the upper surface of the wafer level chip scale package 20. These under-bump metallization areas are connected to the bond pads 14 by means of the electrically conducting segments which are distributed in the wafer level chip scale package 20, within the layers 21. For the sake of clarity of the drawings, FIG. 1b shows an under-bump metallization area 23 for one of the bond pads 14 only. It will nevertheless be appreciated by the one with ordinary skills that all the bond pads 14 can be connected in a similar manner to respective under-bump metallization areas.

S200 denotes a surface of the external support 200 which faces the upper surface of the wafer level chip scale package 20 when the semiconductor device package 100 and the external support 200 are assembled with one another. The assembly is performed by arranging solder balls for connecting electrically and rigidly each under-bump metallization area to a respective one of contact areas which are provided at the surface S200 of the external support 200. Reference number 201 denotes the contact area of the external support 200 which is connected in this way to the under-bump metallization area 23 through the solder ball 24.

As just explained, a segment 22 electrically connects one of the bond pads 14 to one of the under-bump metallization area 23, within the wafer level chip scale package 20. According to the layout of FIGS. 1a and 1b, the under-bump metallization area 23 is situated above the circuit block 101. Thus, a capacitive interaction I1 exists between the under-bump metallization area 23 and electronic components of the circuit block 101. Simultaneously, a capacitive interaction I2 exists between the under-bump metallization area 23 and metal tracks and vias (not shown in the drawings) contained in the layers 12. In particular, the circuit block 101 can be an amplifier for signals above 30 GHz which are transferred through the under-bump metallization area 23. Thus, the interactions I1 and I2 can form short-circuit paths for these signals, and cause disturbance or even dysfunction in the circuit operation.

Figure 2B:
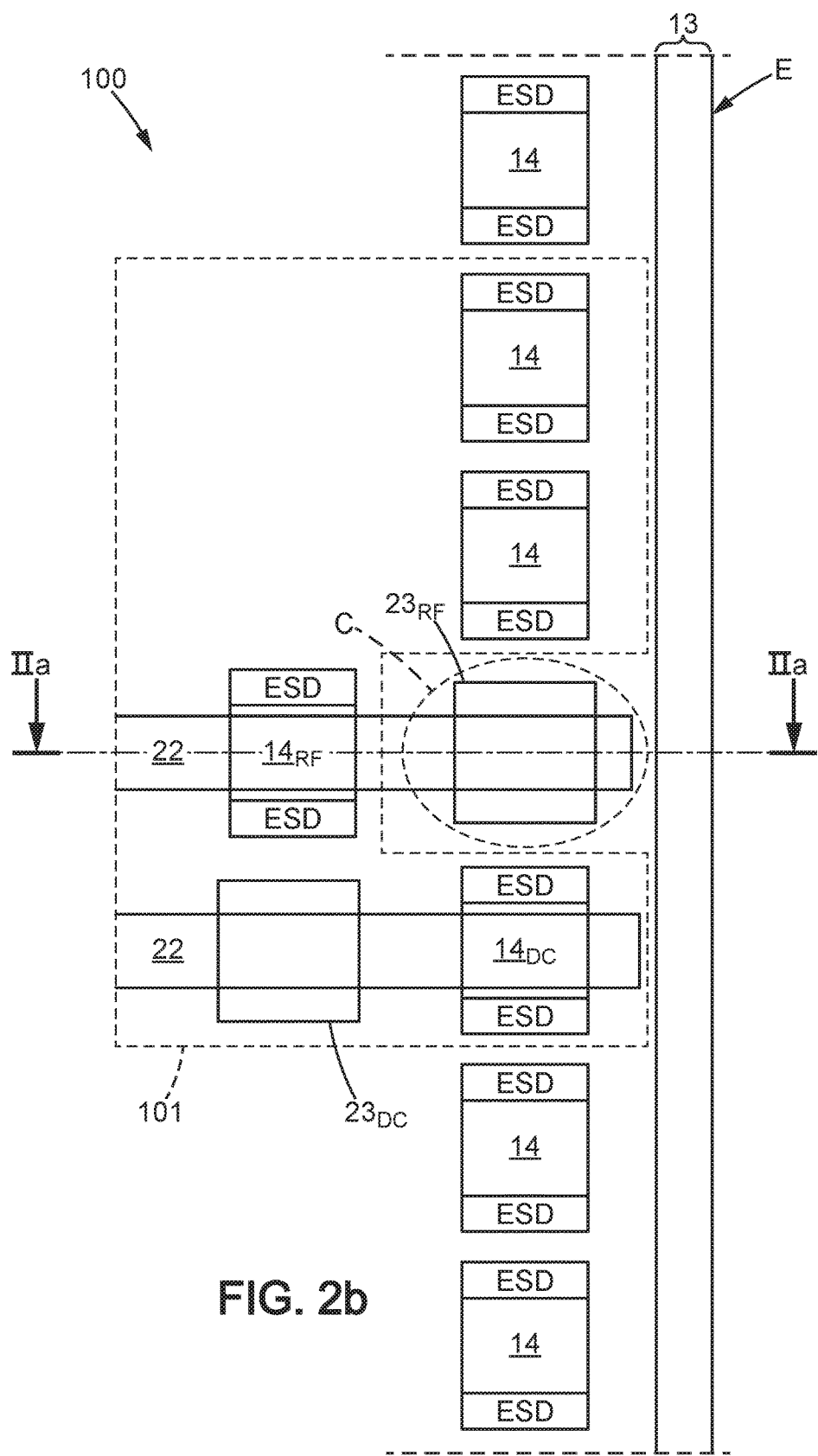

With reference to FIGS. 2a and 2b which relate to an embodiment example of the invention, a RF under-bump metallization area 23RF is connected to at least one bond pad 14RF by an electrically conducting segment 22. The conducting segment 22 is arranged again within the wafer level chip scale package 20. The layers 12 and the semiconductor substrate 11 are devoid of electrically conducting parts with resistivity less than 10 Ohm·cm within an exclusion cylinder C which extends parallel to the stacking direction D and contains the RF under-bump metallization area 23RF. Thus, the circuit block 101 has a peripheral limit (represented by the dashed line in the figures) within the semiconductor substrate 11 which excludes the cylinder C. That way, no significant electrically conducting part is located below the RF under-bump metallization area 23RF. Capacitive interactions with such conducting parts are thus suppressed, or at least significantly reduced.

In the layout as shown in FIGS. 2a and 2b, all bond pads 14 other than bond pad 14RF are aligned parallel to and close to the seal ring 13. For these bond pads 14 and for other bond pads, in particular that one which is labelled 14DC, the bond pad is closer to the seal ring 13 than the under-bump metallization area to which it is connected through a conducting segment 22 (see under-bump metallization area 23DC connected to the bond pad 14DC). Conversely, the under-bump metallization area 23RF is closer to the seal ring 13 than the corresponding bond pad 14RF. To achieve this result, the electrically conducting segments 22 can be configured to extend substantially perpendicular to the seal ring 13, the latter being parallel to the external chip limit E, for example.

Since no significant capacitive interaction exists between the under-bump metallization area 23RF and any circuit part located in the layers 12 and the substrate 11, the under-bump metallization area 23RF is suitable for transferring signals with frequencies above 30 GHz without short-circuit effect affecting for such signals. The other under-bump metallization areas 23, in particular 23DC, can be used for grounding purpose, or for transferring continuous voltage such as power supply voltage to the circuit chip 10. For this reason, they are referred to as DC under-bump metallization areas in the present description, but they can be used, further, for transferring electrical signals with frequencies low enough for not producing any short-circuit effect with the underlying circuit parts.

It will be appreciated that, though FIGS. 2a and 2b show one RF under-bump metallization area 23RF only, the electrical circuit 100 can contain any number of such RF under-bump metallization areas depending on the application.

For each under-bump metallization area 23, including the RF under-bump metallization areas 23RF and the DC under-bump metallization areas 23DC, a respective solder ball 24 is configured to electrically and rigidly connect this under-bump metallization area to one of the contact areas of the external support 200. The semiconductor device package 100 and the external support 200 form the electrical device as presented in this description.

Figure 3:
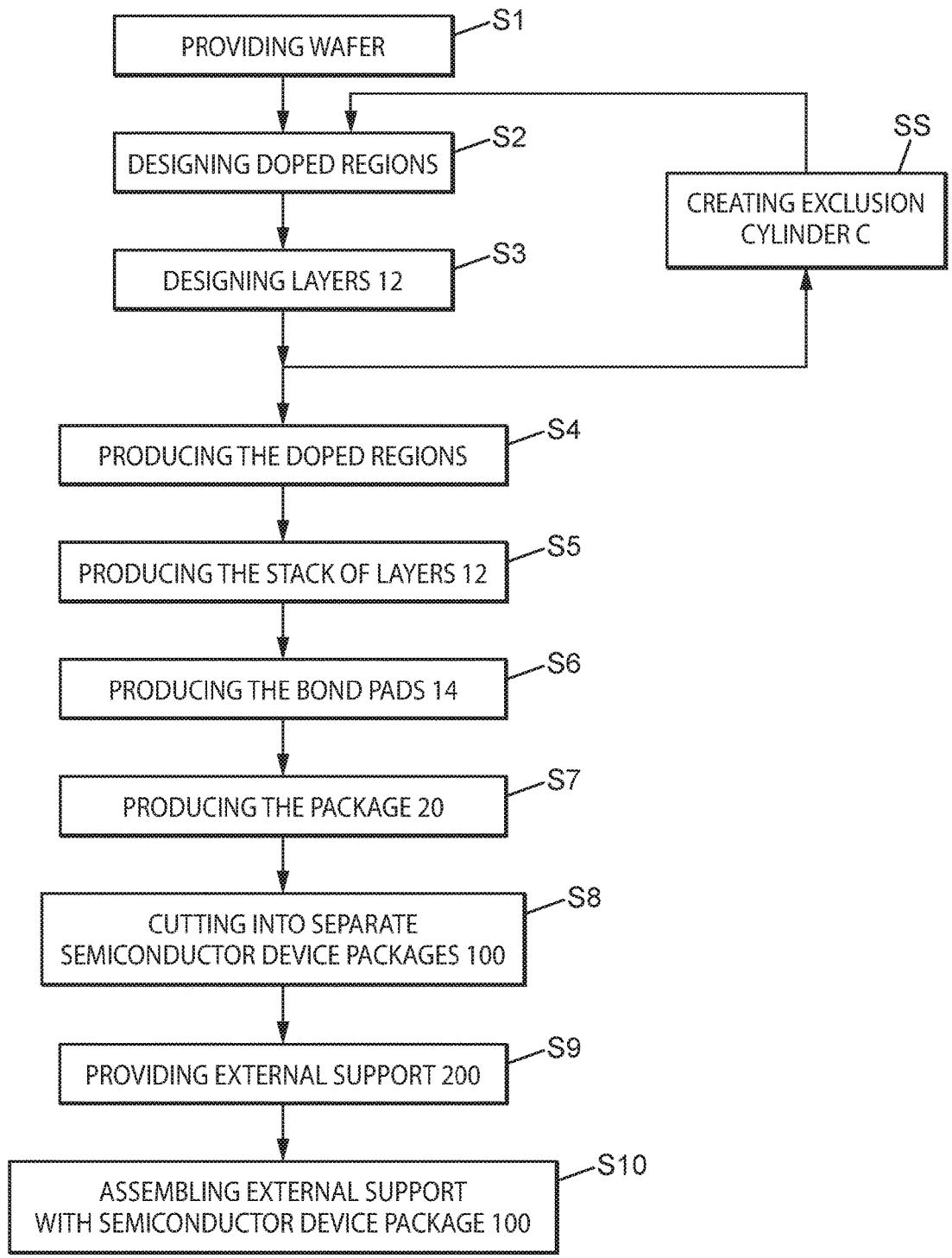
FIG. 3 schematically show a flow chart illustrating steps of a method of manufacturing semiconductor device packages in accordance with another aspect of the invention.

References S1 to S10 in FIG. 3 illustrate steps of a process for manufacturing electrical devices. A number of integrated circuits are manufactured in parallel from one and the same semiconductor wafer (step S1). This process includes designing doped regions in the wafer for forming all the integrated circuits (steps S2 and S4), and forming the layers 12 with conducting tracks and vias for electrically connecting the circuit components for all the integrated circuits simultaneously (steps S3 and S5). Then, the bond pads 14 are formed also simultaneously for all the integrated circuits on the wafer surface, which corresponds to the upper stack surface S12 (steps S6).

When the WLCSP technology is implemented, suitable electrically insulating layers 21 and electrically conducting segments 22 are formed on the whole wafer, for forming a general package over all the integrated circuits (step S7). Under-bump metallization areas such as areas 23, 23RF, 23DC as shown and the solder balls 24 are formed at once for the whole wafer. Then, the wafer is cut to form the separate semiconductor device packages 100, each comprised of a wafer portion forming its substrate 11, covered with part of the layers 12 and part of the general package (step S8). Finally, each semiconductor device package 100 can be assembled onto an external support 200 by means of, for example, solder balls 24 (steps S9 and S10). Such process may implement directly the invention by performing steps S2 and S3 appropriately.

But the commonly implemented process may be modified by adding the step SS indicated on the right part of FIG. 3, specifically for implementing the invention according to possible invention implementations. Starting from the layout of the doped regions and the layers 12 as resulting from the previous execution of steps S2 and S3, those of the under-bump metallization areas 23 which are intended to transfer signals with frequencies higher than, e.g. 30 GHz during operations of the corresponding electrical circuits are identified. For these identified under-bump metallization areas, referred to as the RF under-bump metallization areas 23RF, the layout of the doped regions and the layers 12 is modified according to additional step SS. The bond pad 14RF which corresponds to each under-bump metallization area 23RF at the upper stack surface S12, respectively, is arranged at some distance from the seal ring 13 of the corresponding circuit 100, into the direction of a center part of this circuit. The distance is at least equal to an in-plane dimension of the RF under-bump metallization area 23RF, so that the RF under-bump metallization area 23RF can be inserted in projection between the bond pad 14RF and the seal ring 13. Thus, an exclusion cylinder C is formed, which extends parallel to the stacking direction D. The exclusion cylinder C has a cylinder cross-section large enough to contain a portion of the surface of the circuit which is dedicated to the under-bump metallization area 23RF. In some embodiments, the cylinder cross-section can be significantly larger than the under-bump metallization area 23RF, which allows ensuring that no significant capacitive interaction remains between the under-bump metallization area 23RF and any electrically conducting material portion of the corresponding circuit.

Step S2 can be repeated while maintaining the wafer devoid of electrical doping within the exclusion cylinder C. More specifically, in some embodiments, compensating doping can be allowed within the exclusion cylinder C provided that the resulting electrical resistivity is kept higher than 10 Ohm·cm. Indeed this limit value is high enough for the capacitive interactions between the under-bump metallization area 23RF and material portions having electrical resistivity higher than this limit value not to cause disturbance during standard operation of the circuit. Step S3 is also repeated while maintaining the layers 12 devoid of any metal portions within the exclusion cylinder C. Such exclusion applies to any electrical connexion such as tracks or vias, but also to any electrically conducting component or metal screen which could be incorporated within the layers 12. It may also apply to metal portions which are dedicated to heat conduction or stress balance. In particular, the bond pad 14RF may be placed on a side of the exclusion cylinder C opposite the seal ring 13 during the further execution of steps S2 and S3. Steps S4 to S6 are executed in accordance with the new design of the doped regions and layers 14 due to the exclusion cylinders which are provided for all the under-bump metallization areas 23RF. Then step S7 is executed so that each under-bump metallization area 23RF is formed within the corresponding exclusion cylinder C.

Practically, step SS and the second execution of steps S2 and S3 can convert a circuit layout of the type illustrated by FIGS. 1a and 1b into a new circuit layout of the type illustrated by FIGS. 2a and 2b, and which is in accordance with the present invention.

Tests and simulations have shown that the capacitance values which exist between one RF under-bump metallization area 23RF as provided by the invention and the electrically conducting portions which are closest to it within the semiconductor device package can be less than 200 fF (femtofarad), even less than 100 fF. Thanks to such values, the invention can be implemented in particular for radar applications using signals with frequencies between 77 GHz and 81 GHz.

Providing the exclusion cylinders and moving the bond pads towards the center of each semiconductor device package may be applied only to the RF under-bump metallization areas 23RF. Indeed, this is unnecessary for the under-bump metallization areas which are not intended to transferring high frequency signals, namely signals above 30 GHz. Then, attending to moving away from the seal ring only those of the bond pads which are associated with RF under-bump metallization areas leads to discontinuous pad ring, with the bond pads 14RF moved back with respect to the other bond pads.

In the foregoing specification, the invention has been described with reference to specific examples of embodiments of the invention. It will, however, be evident that various modifications and changes may be made therein without departing from the broader scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

The semiconductor substrate described herein can be any semiconductor material or combinations of materials, such as gallium arsenide, silicon-germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances so that the embodiments of the invention described herein are, for example, capable of operation in other orientations than those illustrated or otherwise described herein.

Some of the above embodiments, as applicable, may be implemented using a variety of different processing methods. For example, although FIGS. 2a and 2b and the discussion thereof describe one exemplary integrated circuit architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention.

Other modifications, variations and alternatives are also possible. The specification and drawings are, accordingly, to be regarded in an illustrative rather than in a restrictive sense.

In the claims, any reference signs placed between parentheses shall not be construed as limiting the claim. The word "comprising" does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A semiconductor device package comprising:
   a circuit chip having a semiconductor substrate with an upper substrate surface, and further having a plurality of interconnect layers stacked on the upper substrate surface of the semiconductor substrate along a given stacking direction, said semiconductor substrate incorporating electrically doped regions having electrical resistivity values of less than 10 Ohm·cm, and said stack of interconnect layers incorporating metal tracks and vias configured to electrically connect doped regions of the semiconductor substrate;

bond pads located at an upper stack surface of the stack of interconnect layers opposite the semiconductor substrate, and electrically connected to at least some of the tracks and vias, the upper substrate surface and the upper stack surface both extending generally perpendicular to the stacking direction; and a wafer level chip scale package located on the upper stack surface, said wafer level chip scale package incorporating a plurality of under-bump metallization areas each provided with a respective solder ball dedicated for connecting the semiconductor device package to an external support, and said wafer level chip scale package further incorporating electrically conducting segments extending parallel to the upper stack surface and each connecting at least one of the bond pads to at least one of the under-bump metallization areas;

wherein the interconnect layers and the substrate are devoid of any material portion having an electrical resistivity less than 10 Ohm·cm within at least one exclusion cylinder extending parallel to the stacking direction from a first one of the under-bump metallization areas, and the substrate is devoid of electrical doping or has mutually compensating electrical doping loads within the exclusion cylinder.

2. A semiconductor device package comprising:

a circuit chip having a semiconductor substrate with an upper substrate surface, and further having a plurality of interconnect layers stacked on the upper substrate surface of the semiconductor substrate along a given stacking direction, said semiconductor substrate incorporating electrically doped regions having electrical resistivity values of less than 10 Ohm·cm, and said stack of interconnect layers incorporating metal tracks and vias configured to electrically connect doped regions of the semiconductor substrate;

bond pads located at an upper stack surface of the stack of interconnect layers opposite the semiconductor substrate, and electrically connected to at least some of the tracks and vias, the upper substrate surface and the upper stack surface both extending generally perpendicular to the stacking direction; and a wafer level chip scale package located on the upper stack surface, said wafer level chip scale package incorporating a plurality of under-bump metallization areas each provided with a respective solder ball dedicated for connecting the semiconductor device package to an external support, and said wafer level chip scale package further incorporating electrically conducting segments extending parallel to the upper stack surface and each connecting at least one of the bond pads to at least one of the under-bump metallization areas;

wherein the interconnect layers and the substrate are devoid of any material portion having an electrical resistivity less than 10 Ohm·cm within at least one exclusion cylinder extending parallel to the stacking direction from a first one of the under-bump metallization areas, and the first under-bump metallization area is configured to transfer signals having a frequency higher than 30 GHz, from the semiconductor device package to the external support or from the external support to the semiconductor device package, during electrical operation of the semiconductor device package.

3. A semiconductor device package comprising:

a circuit chip having a semiconductor substrate with an upper substrate surface, and further having a plurality of interconnect layers stacked on the upper substrate surface of the semiconductor substrate along a given stacking direction, said semiconductor substrate incorporating electrically doped regions having electrical resistivity values of less than 10 Ohm·cm, and said stack of interconnect layers incorporating metal tracks and vias configured to electrically connect doped regions of the semiconductor substrate;

bond pads located at an upper stack surface of the stack of interconnect layers opposite the semiconductor substrate, and electrically connected to at least some of the tracks and vias, the upper substrate surface and the upper stack surface both extending generally perpendicular to the stacking direction; and a wafer level chip scale package located on the upper stack surface, said wafer level chip scale package incorporating a plurality of under-bump metallization areas each provided with a respective solder ball dedicated for connecting the semiconductor device package to an external support, and said wafer level chip scale package further incorporating electrically conducting segments extending parallel to the upper stack surface and each connecting at least one of the bond pads to at least one of the under-bump metallization areas;

wherein the interconnect layers and the substrate are devoid of any material portion having an electrical resistivity less than 10 Ohm·cm within at least one exclusion cylinder extending parallel to the stacking direction from a first one of the under-bump metallization areas, and a projection of the first under-bump metallization area along the stacking direction in a projection plane perpendicular to said stacking direction is closer to a corresponding projection of a seal ring of the semiconductor device package, than a corresponding projection of a bond pad which is connected to said first under-bump metallization area by an electrically conducting segment within the wafer level chip scale package.

4. The semiconductor device package of claim 3, wherein a projection along the stacking direction in a projection plane perpendicular to said stacking direction, of a bond pad which is connected by an electrically conducting segment within the wafer level chip scale package to a second under-bump metallization area different from the first under-bump metallization area, is closer to a corresponding projection of the seal ring of the semiconductor device package than a corresponding projection of said second under-bump metallization area.

5. An electronic device comprising:

a semiconductor device package including a circuit chip with a semiconductor substrate having an upper substrate surface, and further having a plurality of interconnect layers stacked on the upper substrate surface of the semiconductor substrate along a given stacking direction, said semiconductor substrate incorporating electrically doped regions having electrical resistivity values of less than 10 Ohm·cm, and a stack of interconnect layers incorporating metal tracks and vias configured to electrically connect doped regions of the semiconductor substrate;

bond pads located at an upper stack surface of the stack of interconnect layers opposite the semiconductor substrate, and electrically connected to at least some of the tracks and vias, the upper substrate surface and the upper stack surface both extending generally perpendicular to the stacking direction; and a wafer level chip scale package located on the upper stack surface, said wafer level chip scale package incorporating a plurality of under-bump metallization areas each provided with a respective solder ball dedicated for connecting the integrated circuit to an external support, and said wafer level chip scale package further incorporating electrically conducting segments extending parallel to the upper stack surface and each connecting at least one of the bond pads to at least one of the under-bump metallization areas;

wherein the interconnect layers and the substrate are devoid of any material portion having an electrical resistivity less than 10 Ohm·cm within at least one exclusion cylinder extending parallel to the stacking direction from a first one of the under-bump metallization areas, an external support incorporating electrical contact areas located at one surface of said external support, each of said electrical contact areas facing a respective one of the under-bump metallization areas of the wafer level chip scale package; and solder balls each connecting rigidly one of the under-bump metallization areas of the wafer level chip scale package to a respective one of the electrical contact areas of the external support, wherein the first under-bump metallization area is configured to transfer signals having a frequency higher than 30 GHz from the semiconductor device package to the external support or from the external support to the semiconductor device package, during electrical operation of the electronic device.

6. The electronic device of claim 5, wherein the external support is a printed circuit board.

7. The electronic device of claim 5, wherein the external support is a low-temperature co-fired ceramic.

8. A method of manufacturing electronic devices, comprising:

forming a circuit chip by inserting electrically doped regions with electrical resistivity values of less than 10 Ohm·cm in a semiconductor substrate having an upper substrate surface, and by stacking along a given stacking direction, a plurality of interconnect layers on the upper substrate surface of the semiconductor substrate, the stack of interconnect layers being designed so as to incorporate metal tracks and vias electrically connecting doped regions of the semiconductor substrate;

forming bond pads at an upper stack surface of the stack of interconnect layers opposite the semiconductor substrate, said bond pads electrically connecting to at least some of the tracks and vias of the stack of interconnect layers, the upper substrate surface and the upper stack surface both extending generally perpendicular to the stacking direction;

forming a wafer level chip scale package on the upper stack surface, said wafer level chip scale package being designed to incorporate a plurality of under-bump metallization areas each provided with a respective solder ball suitable for connecting the semiconductor device package to an external support, and said wafer level chip scale package being further designed to incorporate electrically conducting segments extending parallel to the upper stack surface and each connecting at least one of the bond pads to at least one of the under-bump metallization areas, wherein the interconnect layers and the substrate are made devoid of any material portion having an electrical resistivity less than 10 Ohm·cm within at least one exclusion cylinder extending parallel to the stacking direction from a first one of the under-bump metallization areas;

cutting the wafer provided with the stack of interconnect layers, the bond pads and the wafer level chip scale package, so as to separate the electronic devices one from each other;

forming electrical contact areas at a surface of at least one support external, said electrical contact areas being so distributed at said surface of said external support that each one of the electrical contact areas faces a respective one of the under-bump metallization areas of the wafer level chip scale package of one of the semiconductor device packages which contains the first under-bump metallization area; and assembling the semiconductor device package which contains the first under-bump metallization area with the external support, by using the solder balls for rigidly connecting each of the under-bump metallization areas to a respective one of the electrical contact areas of the external support.

9. The method of claim 8, further comprising designing the interconnect layers so that said interconnect layers are devoid of any metal portion within the exclusion cylinder associated to the first under-bump metallization area.

10. A method of manufacturing electronic devices, comprising:

forming a circuit chip by inserting electrically doped regions with electrical resistivity values of less than 10 Ohm·cm in a semiconductor substrate having an upper substrate surface, and by stacking along a given stacking direction, a plurality of interconnect layers on the upper substrate surface of the semiconductor substrate, the stack of interconnect layers being designed so as to incorporate metal tracks and vias electrically connecting doped regions of the semiconductor substrate;

forming bond pads at an upper stack surface of the stack of interconnect layers opposite the semiconductor substrate, said bond pads electrically connecting to at least some of the tracks and vias of the stack of interconnect layers, the upper substrate surface and the upper stack surface both extending generally perpendicular to the stacking direction; and forming a wafer level chip scale package on the upper stack surface, said wafer level chip scale package being designed to incorporate a plurality of under-bump metallization areas each provided with a respective solder ball suitable for connecting the semiconductor device package to an external support, and said wafer level chip scale package being further designed to incorporate electrically conducting segments extending parallel to the upper stack surface and each connecting at least one of the bond pads to at least one of the under-bump metallization areas, wherein the interconnect layers and the substrate are made devoid of any material portion having an electrical resistivity less than 10 Ohm·cm within at least one exclusion cylinder extending parallel to the stacking direction from a first one of the under-bump metallization areas;

forming the doped regions within the wafer so that said wafer is devoid of electrical doping or has mutually compensating electrical dopings within the exclusion cylinder associated to the first under-bump metallization area.

11. A method of manufacturing electronic devices, comprising:
    forming a circuit chip by inserting electrically doped regions with electrical resistivity values of less than 10 Ohm·cm in a semiconductor substrate having an upper substrate surface, and by stacking along a given stacking direction, a plurality of interconnect layers on the upper substrate surface of the semiconductor substrate, the stack of interconnect layers being designed so as to incorporate metal tracks and vias electrically connecting doped regions of the semiconductor substrate;
    forming bond pads at an upper stack surface of the stack of interconnect layers opposite the semiconductor substrate, said bond pads electrically connecting to at least some of the tracks and vias of the stack of interconnect layers, the upper substrate surface and the upper stack surface both extending generally perpendicular to the stacking direction; and
    forming a wafer level chip scale package on the upper stack surface, said wafer level chip scale package being designed to incorporate a plurality of under-bump metallization areas each provided with a respective solder ball suitable for connecting the semiconductor device package to an external support, and said wafer level chip scale package being further designed to incorporate electrically conducting segments extending parallel to the upper stack surface and each connecting at least one of the bond pads to at least one of the under-bump metallization areas, wherein
        the interconnect layers and the substrate are made devoid of any material portion having an electrical resistivity less than 10 Ohm·cm within at least one exclusion cylinder extending parallel to the stacking direction from a first one of the under-bump metallization areas, and
        the first under-bump metallization area is configured to transfer signals having a frequency higher than 30 GHz, from the semiconductor device package to the external support or from said external support to said semiconductor device package, during electrical operation of the semiconductor device package which contains the first under-bump metallization area.

12. A method of manufacturing electronic devices, comprising:
    forming a circuit chip by inserting electrically doped regions with electrical resistivity values of less than 10 Ohm·cm in a semiconductor substrate having an upper substrate surface, and by stacking along a given stacking direction, a plurality of interconnect layers on the upper substrate surface of the semiconductor substrate, the stack of interconnect layers being designed so as to incorporate metal tracks and vias electrically connecting doped regions of the semiconductor substrate;
    forming bond pads at an upper stack surface of the stack of interconnect layers opposite the semiconductor substrate, said bond pads electrically connecting to at least some of the tracks and vias of the stack of interconnect layers, the upper substrate surface and the upper stack surface both extending generally perpendicular to the stacking direction;
    forming a wafer level chip scale package on the upper stack surface, said wafer level chip scale package being designed to incorporate a plurality of under-bump metallization areas each provided with a respective solder ball suitable for connecting the semiconductor device package to an external support, and said wafer level chip scale package being further designed to incorporate electrically conducting segments extending parallel to the upper stack surface and each connecting at least one of the bond pads to at least one of the under-bump metallization areas, wherein the interconnect layers and the substrate are made devoid of any material portion having an electrical resistivity less than 10 Ohm·cm within at least one exclusion cylinder extending parallel to the stacking direction from a first one of the under-bump metallization areas; and
    designing the wafer level chip scale package so that a projection of the first under-bump metallization area along the stacking direction in a projection plane perpendicular to said stacking direction is closer to a corresponding projection of a seal ring of the semiconductor device package, than a corresponding projection of a bond pad which is connected to said first under-bump metallization area by an electrically conducting segment within the wafer level chip scale package.

13. The method of claim 12, further comprising designing the wafer level chip scale package so that a projection along the stacking direction in a projection plane perpendicular to said stacking direction, of a bond pad which is connected by an electrically conducting segment within the wafer level chip scale package to a second under-bump metallization area different from the first under-bump metallization area, is closer to a corresponding projection of the seal ring of the semiconductor device package than a corresponding projection of said second under-bump metallization area.

14. The method of claim 12, further comprising designing the circuit chip by initially arranging all bond pads on straight line segments extending parallel to segments of the seal ring of the semiconductor device package, and then moving the bond pad which is intended to be connected to the first under-bump metallization area, away from the seal ring for forming the exclusion cylinder which extends parallel to the stacking direction between said bond pad and the seal ring.

15. The method of claim 14, further comprising designing the wafer level chip scale package so that the first under-bump metallization area is located within the exclusion cylinder.

* * * * *